(12) United States Patent
Sekimoto et al.

(10) Patent No.: US 6,518,331 B2
(45) Date of Patent: Feb. 11, 2003

(54) COMPOSITION OF EPOXY RESINS AND CURING AGENT CAPABLE OF BEING COARSENED

(75) Inventors: Akio Sekimoto, Tsurugashima (JP); Shinichi Yamada, Ageo (JP)

(73) Assignee: Taiyo Ink Manufacturing Co., Ltd. (JP)

( * ) Notice: Subject to any disclaimer, the term of this patent is extended or adjusted under 35 U.S.C. 154(b) by 0 days.

(21) Appl. No.: 09/729,211

(22) Filed: Dec. 5, 2000

(65) Prior Publication Data

US 2001/0000518 A1 Apr. 26, 2001

Related U.S. Application Data

(62) Division of application No. 08/437,382, filed on Mar. 16, 1998.

(30) Foreign Application Priority Data

May 13, 1994 (JP) .............................................. 6-123324

(51) Int. Cl.$^7$ ........................... B32B 31/26; C08K 3/24; C08L 63/02; C08L 63/04
(52) U.S. Cl. ........................ 523/428; 156/252; 523/427; 523/429; 525/423; 525/486; 525/488; 525/511; 525/524; 525/525; 525/526; 525/527
(58) Field of Search .................................. 525/113, 524, 525/423, 486, 488, 511, 525, 526, 527; 523/428, 429, 427; 156/252

(56) References Cited

U.S. PATENT DOCUMENTS 4,086,128 A * 4/1978 Sugio et al. ................. 156/668
5,153,987 A * 10/1992 Takahashi et al. ............. 427/97
5,260,130 A * 11/1993 Sakaguchi et al. .......... 428/355
5,532,105 A * 7/1996 Yamadera et al. .......... 430/156

* cited by examiner

Primary Examiner—Robert E. L. Sellers
(74) Attorney, Agent, or Firm—Rader, Fishman, & Grauer PLLC

(57) ABSTRACT

A multilayer printed circuit board having resinous insulating layers and conductor layers alternately superposed on a circuit board with ample adhesive strength, a method for the production thereof, and a curable resin composition useful for the formation of resinous insulating layers are disclosed. The manufacture of the multilayer printed circuit board is accomplished by applying the curable resin composition to the surface of conductor layer of the circuit board, thermally curing the applied layer thereby forming resinous insulating layer, then boring a through-hole in the circuit board, treating the resinous insulating layer with a coarsening agent thereby imparting undulating coarsened surface thereto, subsequently coating the surface of resinous insulating layer and the inner surface of the through-hole with a conductor layer as by electroless plating, and thereafter forming a prescribed circuit pattern in the conductor layer. The curable resin composition comprises (A) epoxy resins and (B) an epoxy resin curing agent as essential components thereof and optionally contains a rubber component and a filler capable of being decomposed or dissolved by a coarsening agent. This composition contains in combination a bisphenol A type epoxy resin having an epoxy equivalent of not less than 400 and an epoxy resin having an epoxy equivalent of less then 400.

13 Claims, 1 Drawing Sheet

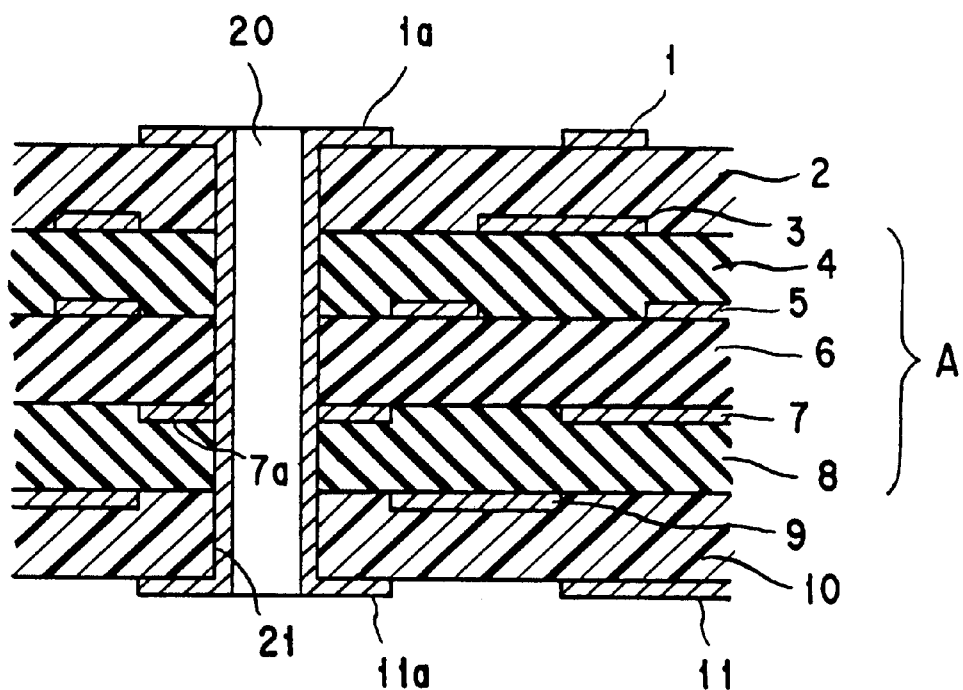

COMPOSITION OF EPOXY RESINS AND CURING AGENT CAPABLE OF BEING COARSENED

This application is a divisional of Application No. 08/437,382 filed Mar. 16, 1998, pending.

BACKGROUND OF THE INVENTION

1. Field of the Invention

This invention relates to a curable resin composition which, in a multilayer printed circuit board having conductor circuit layers and insulating layers alternately built up or superposed on a substrate, is capable of forming insulating layers excelling in adhesiveness with conductor layers and also excelling in resistance to heat, a multilayer printed circuit board manufactured by using the curable resin composition, and a method for the production thereof.

2. Description of the Prior Art

For the production of a multilayer printed circuit board, a method which comprises laminating a plurality of circuit boards having a prescribed circuit patter-n formed in advance thereon through the medium of prepregs as adhesive insulating layers, pressing the laminate thus obtained, drilling and making plated through-holes to interconnect the circuits in the component layers has been heretofore known to the art (lamination pressing method). The lamination pressing method, however, necessitates use of production facilities which are very voluminous and highly expensive and incurs difficulty in forming fine patterns because the copper used in plating through-holes enters the outer layers and adds to the thickness of copper deposit.

In recent years, strenuous efforts are being continued for the development of a multilayer printed circuit board having conductor layers and organic insulating films alternately built up or superposed on a substrate (build-up method) for the purpose of overcoming such problems as are attendant on the conventional method mentioned above. In this build-up method, such techniques as vacuum deposition and sputtering are generally adopted for the formation of conductor layers on insulating layers. The method, however, is at a disadvantage in betraying inferior productivity and entailing high cost.

In another method of producing a printed circuit board, a "fully additive" technique is employed. As one of the "fully additive" method, Japanese Patent Publication No. 4-6116 discloses a method which forms a conductor layer by electroless copper plating through the medium of an adhesive layer formed on an insulating substrate. In this method, an adhesive agent composed mainly of rubber, a filler, and a thermosetting resin is used for improving the adhesive force to be exhibited by a plating film to the adhesive layer. This adhesive agent is applied to the insulating substrate and allowed to harden thereon to produce the adhesive layer. Then, the adhesive layer is treated as with a mixture of chromate and sulfuric acid and cleansed with hot water to give rise to a surface construction in which the depressions formed in consequence of the removal of filler particles and the protrusions of rubber particles exposed in consequence of the removal of thermosetting resin are uniformly distributed. This method, however, is at a disadvantage in suffering the rubber component to persist within the adhesivie layer and cause degradation of such properties as resistance to heat and electrical insulating properties.

SUMMARY OF THE INVENTION

An object of the present invention, therefore, is to provide a curable resin composition which, in the production of a multilayer printed circuit board having conductor layers severally bearing a prescribed circuit pattern and resinous insulating layers alternately built up or superposed on a substrate, accomplishes highly satisfactory bonding between the component layers by virtue of an epoxy resin excelling in resistance to heat and electrical insulating properties without requiring the resinous insulating layers to use a rubber component as an essential component and enables the conductor layers to exhibit necessary adhesiveness to the insulating layer.

Another object of the present invention is to provide a multilayer printed circuit board having resinous insulating layers and conductor layers alternately built up on a substrate and joined each other with highly satisfactory adhesive strength and enabling the resinous insulating layers to excel in various properties such as resistance to heat and electrical insulation which are expected from a printed circuit board and a method capable of producing the multilayer printed circuit board inexpensively with high productivity.

To accomplish the objects mentioned above, in accordance with one aspect of the present invention, there is provided a curable resin composition which comprises (A) epoxy resins and (B) an epoxy resin curing agent as essential components thereof, the epoxy resins (A) comprising (A-1) a bisphenol A type epoxy resin having an epoxy equivalent of not less than 400 and (A-2) an epoxy resin having an epoxy equivalent of less than 400 and containing at least two epoxy groups in the molecular unit thereof in the ratio of the epoxy resins (A-1:A-2) in the range of from 30:70 to 90:10 by weight so that a cured coating film formed of this resin composition can be partially decomposed or dissolved with a coarsening agent and consequently endowed with an undulating coarsened surface, and the epoxy resin curing agent (B) containing at least two active hydrogen atoms in the molecular unit thereof.

In a preferred embodiment of the present invention, the curable resin composition is allowed to contain, in addition to the essential components mentioned above, a rubber component in a proportion of not more than 40 parts by weight, based on 100 parts by weight of the epoxy resins (A) and optionally further contain a filler capable of being decomposed or dissolved by a coarsening agent in a proportion of less than 70 parts by weight, desirably not more than 50 parts by weight, based on 100 parts by weight of the epoxy resins (A) mentioned above.

In accordance with another aspect of the present invention, there is further provided a method for the production of a multilayer printed circuit board having resinous insulating layers and conductor layers severally bearing a prescribed circuit pattern sequentially superposed on a conductor layer of a circuit board having a prescribed circuit pattern formed in advance thereon, wherein the formation of resinous insulating layers and conductor layers comprises the steps of (a) forming the resinous insulating layer by coating a circuit board with the curable resin composition according to the present invention and subjecting the resultant applied layer to a thermal curing treatment, (b) treating the surface of the resultant resinous insulating layer with a coarsening agent thereby imparting an undulating coarsened surface to the resinous insulating layer, and (c) forming a conductor layer on the coarsened surface of the resinous insulating layer. This method for the production of the multilayer printed circuit board, in ore concrete embodiment, further comprises the steps of boring prescribed through-holes in the circuit board after the formation of the outermost resinous insulating layer, treating the surfaces of the resinous insulating layer mentioned above and the through-holes with a coarsening agent thereby imparting coarsened surfaces thereto, and thereafter forming the outermost conductor layer on the coarsened surface of the outermost resinous insulating layer.

Preferably, the coating of the resinous insulating layer with the conductor layer is effected by electroless plating and/or electrolytic plating and at least one member selected from the group consisting of oxidizing agent, alkali solution, and organic solvent is used as the coarsening agent.

When the screen printing technique, for example, is used in coating the conductor layer of the circuit board with the resinous insulating layer mentioned above, it will be difficult to obtain an applied film of desired thickness by a single coating work. In the case of this sort, the curable resin composition of the present invention may be applied repeatedly or the resinous insulating layer may be formed preparatorily with an ordinary solder resist possessing adhesiveness to the conductor layer, desirably a curable resin composition composed mainly of an epoxy resin and an epoxy resin curing agent, and then coated with the curable resin composition according to the present invention. Thus, the applied coating consequently formed functions as an adhesive layer for the conductor layer to be formed afterward.

By the aforementioned method, there can be manufactured with high productivity a multilayer printed circuit board which has a resinous insulating layer and a conductor layer bearing a prescribed circuit pattern sequentially superposed on a conductor layer of a circuit board having a prescribed circuit pattern formed in advance thereon, in which the resinous insulating layer is formed of a cured coating film of the resin composition according to the present invention, the surface of this resinous insulating layer which defines the interface with the conductor layer to be applied thereon is formed in an undulating rough surface by a coarsening treatment, and the conductor layer is joined to the resinous insulating layer through the medium of the rough surface thereof.

BRIEF DESCRIPTION OF THE DRAWING

The single FIGURE is an enlarged, fragmentary cross-sectional view schematically illustrating one example of the construction of a multilayer printed circuit board obtained by applying the method of the present invention to a laminated circuit board.

DETAILED DESCRIPTION OF THE INVENTION

The present invention is characterized prominently by the fact that, in the alternate build-up of resinous insulating layer(s) and conductor layer(s) bearing a prescribed circuit pattern on a conductor layer of a circuit board having a prescribed circuit pattern formed in advance thereon in the manufacture of a multilayer printed circuit board, a curable resin composition which comprises (A) epoxy resins and (B) an epoxy resin curing agent or hardener as essential components thereof, the epoxy resins (A) comprising (A-1) a bisphenol A type epoxy resin having an epoxy equivalent of not less than 400 and (A-2) an epoxy resin having an epoxy equivalent of less than 400 and containing at least two epoxy groups in the molecular unit thereof in the ratios (A-1:A-2) varying from 30:70 to 90:10 by weight so that a cured coating film formed of this resin composition can be partially decomposed or dissolved with a coarsening agent or roughening agent and consequently endowed with an undulating coarsened surface, and the epoxy resin curing agent (B) containing at least two active hydrogen atoms in the molecular unit thereof, is used for the resinous insulating layer.

Specifically, the component (A-1) of the epoxy resins (A) mentioned above has an epoxy equivalent of not less than 400 and contains at least one hydroxyl group capable of being easily decomposed or dissolved by a coarsening agent. Owing to the large epoxy equivalent, it acquires a relatively low crosslink density when it is cured with an epoxy resin curing agent containing at least two active hydrogen altos in the molecular unit thereof. Thus, it can be easily coarsened with a coarsening agent. In contrast thereto, the component (A-2) is an epoxy resin having an epoxy equivalent of less than 400 and containing at least two epoxy groups in the molecular unit thereof and possesses either less hydroxyl groups than the component (A-1) or no hydroxyl group. Further, when it is cured with the epoxy resin curing agent, it acquires a high crosslink density because of its small epoxy equivalent. Thus, it is sparingly decomposed or dissolved with a coarsening agent.

Since the curable resin composition to be used for the formation of the resinous insulating layer contains as part of the epoxy resins to be contained therein 30 to 90 parts by weight, based on 100 parts by weight of the epoxy resin components, of a bisphenol A type epoxy resin exhibiting susceptibility to decomposition or dissolution by a coarsening agent and having an epoxy equivalent of not less than 400 as described above, the cured coating film consequently produced reveals a contrast between the part decomposed or dissolved by the coarsening agent and the part not decomposed or dissolved, namely a contrast in terms of the degree with which the coarsening agent induces decomposition or dissolution. By subjecting the resinous insulating layer which has undergone the curing treatment to a surface coarsening treatment with a coarsening agent, therefore, an undulating surface construction can be easily formed on the surface of the cured resinous insulating layer. The undulating coarsened surface of the resinous insulating layer functions as an anchor for the conductor layer to be formed on the resinous insulating layer. When the conductor layer is formed thereon as by electroless plating or electrolytic plating, therefore, the adhesive strength between the resinous insulating layer and the conductor layer is improved and the multilayer printed circuit board free from such problems as broken pattern and separation of parts and excellent in interlinear strength can be produced. Further, since the resinous insulating layer is formed of a cured coating film of epoxy resin, the multilayer printed circuit board to be produced excels in resistance to heat, electrical insulating properties, and the like.

By using a laminated circuit board which is obtained according to the build-up method of the present invention, the multilayer printed circuit board to be produced preeminently excels in peel strength and resistance to the heat of soldering. The multilayer printed circuit board to be obtained with the curable resin composition of the present invention is thought to be highly suitable for the production of such a circuit pattern of fine lines as has been produced by the conventional multilayer printed circuit board only with difficulty.

Examples of bisphenol A type epoxy resins (A-1) mentioned above include, but are not limited to: the products of Yuka-Shell Epoxy K.K. marketed under trademark designation of "EPIKOTE" 1001 and 1004, the products of Dai-Nippon Ink & Chemicals, Inc. marketed under trademark designation of "EPICLON" 900 and 1050, the product of Tohto Kasei K.K. marketed under trademark designation of "Epo Tohto" YD-011, the product of The Dow Chemical Co. marketed under trademark designation of "D.E.R." 661, the products of Ciba-Geigy Ltd. marketed under trademark designation of "ARALDITE" 6071 and 7072, the products of Asahi Chemical Industry Co., Ltd. marketed under trademark designation of "AER" -661 and -664, and the products of Sumitomo Chemical Industries Co., Ltd. marketed under trademark designation of "SUMI-Epoxy" ESA-011, ESA-012, and ESA-014. Besides, brominated bisphenol A type epoxy resins having an epoxy equivalent of not less than 400 and obtained by brominating the bisphenol A type epoxy resins may also be used.

It is necessary that the bisphenol A type epoxy resin (A-1) having an epoxy equivalent of not less than 400 be contained in a proportion of 30 to 90 parts by weight, preferably 50 to 80 parts by weight, in 100 part's by weight of the epoxy resin components to be used. If the bisphenol A type epoxy resin (A-1) mentioned above is contained in a proportion of less than 30 parts by weight in 100 parts by weight of the epoxy resin components to be used, the curable resin composition will be at a disadvantage in that even when the cured resinous insulating layer is subjected to a surface treatment with a coarsening agent, the resinous insulating layer does not easily acquire an undulating surface structure capable of amply functioning as an anchor for the conductor layer to be subsequently formed thereon. Conversely, if the proportion exceeds 90 parts by weight, the produced resinous insulating layer will entail a problem of deficiency in resistance to soldering heat.

As the epoxy resin for the component (A-2) mentioned above, any of the known epoxy compounds (including epoxy oligomers) which have an epoxy equivalent of less than 400 and contain at least two epoxy groups in the molecular unit thereof can be used. As concrete examples of the epoxy resins usable herein, bisphenol A type epoxy resins such as the product of Yuka-Shell Epoxy K.K. marketed under trademark designation of "EPIKOTE" 828, the product of Dai-Nippon Ink & Chemicals, Inc. marketed under trademark designation of "EPICLON" 840, and the product of Tohto Kasei K.K. marketed under trademark designation of "Epo Tohto" YD-128, and bisphenol F type epoxy resins, bisphenol S type epoxy resins, phenol novolak type epoxy resins, cresol novolak type epoxy resins, alicyclic epoxy resins, triazine nucleus-containing epoxy resins, biphenyl type epoxy resins, brominated epoxy resins, dimer acid-modified epoxy resins, trihydroxyphenyl methane type epoxy resins, hydrogenated bisphienol A type epoxy resins, glycidyl amine type epoxy resins, tetraphenylol ethane type epoxy resins, and heterocyclic epoxy resins may be cited.

As concrete examples of the epoxy resin curing agent (B) which contains at least two active hydrogen atoms in the molecular unit thereof and is used essentially in conjunction with the epoxy resins mentioned above in the curable resin composition of the present invention, amines, aminopolyamide resins, and dicyandiamide may be cited. The epoxy resin curing agent which contains at least two active hydrogen atoms in the molecular unit thereof is used for the purpose of obtaining a three-dimensionally cross-linked and cured film composed of the epoxy resins (A-1) and (A-2) mentioned above and consequently endowed with a contrast in terms of the degree with which the film is decomposed or dissolved with the coarsening agent.

Examples of the epoxy resin curing agents mentioned above include, but are not limited to: amines such as diethylene triamine, triethylene tetramine, isophorone diamine, metaxylylene diamine, m-phenylene diamine, p-phenylene diamine, 4,4'-diaminodiphenyl methane, 4,4'-diaminodiphenyl sulfone, 4,4'-diaminodiphenyl ether, and aniline-formalin resin; aminopolyamide resins which are condensates of dimer acids with diethylene triamine, triethylene tetramine, or the like; and latent curing agents such as dicyandiamide, dihydrazide adipate, and hydrazide sebacate.

The amount of the epoxy resin curing agent to be used in the curable resin composition of the present invention is such that the active hydrogen content in the curing agent is in the range of from 0.5 to 1.5 equivalent weights, preferably from 0.8 to 1.2 equivalent weights per the equivalent weight of the epoxy group content in the epoxy resin components when the curing agent is an amino group-containing compound such as an amine and a polyamide resin or in the range of from 0.3 to 0.7 equivalent weight when the curing agent is dicyandiamide.

The curable resin composition of the present invention, when necessary, may incorporate therein any of well-known curing accelerators or promoters for the purpose of promoting the curing reaction of the composition. Examples of the curing promoters include, but are not limited to: tertiary amines such as triethyl amine, tributyl amine, dimethylbenzyl amine, diethylbenzyl amine, 4-(dimethyl-amino)-N,N-dimethyl-benzyl amine, 4-methoxy-N,N-dimethylbenzyl amine, and 4-methyl-N,N-dimethylbenzyl amine; quaternary ammonium salts such as benzyltrimethylammonium chloride and benzyltriethyl-ammonium chloride; phosphines such as triethylphosphine and triphenylphosphine; phosphonium salts such as n-butyl-triphenylphosphonium bromide; imidazoles such as imidazole, 2-methylimidazole, 2-ethylimidazole, 2-ethyl-4-methlylimidazole, 2-phenylimidazole, 1-(2-cyanoethyl)-2-ethyl-4-methylimidazole, or organic acid salts thereof; guanamines such as aceto-guanamine and benzoguanamine. The preferred curing promotors are imidazoles and phosphines.

The curable resin composition of the present invention, when necessary, may contain a rubber component. In the film obtained after the surface coarsening treatment, this rubber component functions as a stress alleviating agent and improves the adhesive strength of the film. As concrete examples of the rubber component, polybutadiene rubbers such as, for example, the product of Idemitsu Kosan Co., Ltd. marketed under product code of R-45HT; urethane-modified, maleated, epoxy-modified, or (meth)acryloyl-modified various polybutadiene rubber derivatives such as, for example, the epoxy-modified product of Idemitsu Kosan Co., Ltd. marketed under product code of R-45EPI; nitrile rubbers such as, for example, the products of JSR K.K. marketed under product codes of N280 and N230S; CTBN (carboxy terminated acrylonitrile rubber) such as, for example, the product of Ube Industries, Ltd. marketed under product code of 1300-31; and CTBN-modified epoxy resins such as, for example, the products of Tohto Kasai K.K. marketed under product codes of YR-102 and YR-450 may be cited.

Further in the curable resin composition of the present invention, the depth of the undulation of the surface of the resinous insulating layer can be increased and the adhesive strength of this layer with the conductor layer can be further enhanced by using a filler capable of being decomposed or dissolved by the coarsening agent in combination with the components of the composition mentioned above. If the filler is incorporated in the composition in a proportion of 70 parts by weight or more, based on 100 parts by weight of the epoxy resins, it will give rise to voids in the cured film or degrade the electrical insulating properties of the film. It is necessary that the content of the filler be less than 70 parts by weight, preferably not more than 50 parts by weight.

The filler mentioned above is known in two kinds; organic filler and inorganic filler. As concrete examples of the organic filler, powdered epoxy resins such as, for example, the product of Nissan Chemicals Industries, Ltd. marketed under trademark designation of "TEPIC"; melamine resins; benzoguanamine resins such as, for example, the products of Nippon Shokubai K.K. marketed under product codes of M-30, S, and MS; urea resins; and cross-linked acryl polymers such as, for example, the products of Soken Kagaku K.K. marketed under product codes of MR-2G and DIR-7G and the product of Sekisui Plastics Co., Ltd. marketed under trademark designation of "Techpolymer" may be cited. As concrete examples of the inorganic filler, magresium oxide, calcium carbonate, zirconium silicate, zirconium oxide, calcium silicate, and calcium hydroxide may be cited.

The curable resin composition of the present invention, when necessary, may incorporate therein any of organic solvents. Examples of the organic solvents include, but are not limited to: ketones such as methylethyl ketone and cyclohexanone; aromatic hydrocarbons such as toluene and xylene; cellosolves such as cellosolve and butyl cellosolve; carbitols such as carbitol and butyl carbitol; and acetates such as ethyl acetate, butyl acetate, cellosolve acetate, butyl cellosolve acetate, carbitol acetate, and butyl carbitol acetate. These organic solvents may be used either singly or in the form of a combination of two or more members.

Further, the curable resin composition of the present invention may incorporate therein, depending on the desired properties thereof, a well known and widely used filler such as barium sulfate, silicon sulfide, talc, clay, silica, bentonite, kaolin, glass fiber, carbon fiber, mica, asbestos, and metal powder; a color pigment such as phthalocyanine blue, phthalocyanine green, titanium oxide, and carbon black; and other various additives such as an anti-foaming agent, an adhesiveness-imparting agent, and a leveling agent.

The manufacture of the multilayer printed circuit board of the present invention begins with the application of the curable resin composition comprising the components mentioned above to the upper surface of a conductor layer of a circuit board bearing a prescribed circuit pattern by any of the known coating methods such as, for example, the screen printing method, spray coating method, and curtain coating method. Some of these coating methods may fail to deposit the composition in a desired thickness in one coating operation. In this case, the application of the composition may be repeated until the desired thickness is obtained. When the coating is repeated, the curable resin composition of the present invention may be used all by itself. Otherwise, some other curable resin composition possessing highly desirable adhesiveness to copper may be applied as an undercoat and, thereafter, the curable resin composition of the present invention may be used as the uppermost layer of coating.

After the resinous insulating layer is produced in a desired thickness by the coating as described above, it is cured by a heat treatment. It is then perforated, when necessary, to form through-holes and other holes therein and, thereafter, subjected to a surface coarsening treatment with a coarsening agent selected from among oxidizing agents, aqueous alkali solutions, and organic solvents to provide the resinous insulating layer and the through-hole parts with highly satisfactory undulating coarsened surfaces. Subsequently, the coarsened surfaces of the resinous insulating layer and through-hole parts thus obtained are coated with a conductor layer by means of electroless plating or electrolytic plating.

The resinous insulating layer, when necessary, is subjected again to a heat treatment (annealing of plate layer) to enhance the crosslink density of the resinous insulating layer and alleviate the stress therein. Thereafter, as popularly practiced, the conductor layer on the surface of the resinous insulating layer is patterned to form a desired circuit. The procedure described above may be repeated, when desired, to implement alternate build-up of resinous insulating layers and conductor layers severally bearing a prescribed circuit pattern. It is provided, however, that the formation of the through-holes be carried out after the formation of the outermost resinous insulating layer. Optionally, the formation of the conductor circuit may be effected by the "fully additive" technique using permanent plating resist.

In the method for the production of the multilayer printed circuit board described above, the temperatures of the heat treatments which are performed between the formation of the resinous insulating layer and the coarsening of surface are desired to be in the range of from 130 to 170° C. Properly, the duration of the heat treatment is approximately 60 to 120 minutes when the temperature is 130° C. or 5 to 20 minutes when the temperature is 170° C., preferably 15 to 60 minutes when the temperature is in the range of from 140° C. to 160° C. If the temperature of heat treatment is less than 130° C., the resinous insulating layer will not be cured enough to withstand the drilling work performed for the formation of through-holes or the punching work otherwise performed by the use of a metal die, which in turn results in occurrence of smear or flaw. In consideration of the possibility of the substrate being shrunken or warped by heat, the upper limit of the temperature of heat treatment should be 170° C., though variable with the kind of the material to be used for the substrate.

Now, embodiments of the present invention will be described in detail below with reference to the accompanying drawing.

First, one example of the construction of a multilayer printed circuit board to be manufactured by the method of the present invention will be described. The multilayer printed circuit board is obtained by forming a first conductor layer 1 bearing a prescribed circuit pattern through the medium of a first resinous insulating layer 2 on the upper surface of a laminated circuit board A and forming a sixth conductor layer 11 bearing a prescribed circuit pattern through the medium of a second resinous insulating layer 10 on the undersurface of the laminated circuit board A as shown in FIGURE. The laminated circuit board A mentioned above results from sequential superposition and union of three substrates 4, 6, and 8 made of glass-fiber-reinforced epoxy resin. A second conductor layer 3 bearing a prescribed circuit pattern is laminated on the surface of the substrate 4 opposite the junction boundary thereof with the substrate 6, a third conductor layer 5 bearing a prescribed circuit pattern is interposed between the substrate 4 and the substrate 6, a fourth conductor layer 7 bearing a prescribed circuit pattern is interposed between the substrate 6 and the substrate 8, and a fifth conductor layer 9 bearing a prescribed circuit pattern is formed on the surface of the substrate 8 opposite the junction boundary thereof with the substrate 6. Thus, the laminated circuit board A mentioned above is possessed of a total of four conductor layers.

The multilayer printed circuit board described above is further provided with a plated-through hole 20 which electrically connects a connection part 1a of the first conductor layer 1 to a connection part 7a of the fourth conductor layer 7 and a connection part 11a of the sixth conductor layer 11. The plated-through hole 20 is so formed as to pierce the first resinous insulating layer 2, the laminated circuit board A, and the second resinous insulating layer 10 and also runs through the central parts of the connection parts 1a, 7a, and 11a from the connection part 1a of the first conductor layer 1 through the connection part 11a of the sixth conductor layer 11. Further, the plated-through hole 20 has a conducting material disposed on the inner wall surface of the through-hole 21 to interconnect the connection parts 1a, 7a, and 11a electrically.

Incidentally, the multilayer printed circuit board is provided with blind via holes which electrically interconnect between the connection parts of the first conductor layer 1 and the second conductor layer 3 and between the connection parts of the sixth conductor layer 11 and the fifth conductor layer 9. These blind via holes roughly resemble the plated-through hole 20 in construction and function to interconnect the connection parts electrically. They are omitted from illustration herein. These blind via holes can be bored by any of the conventional methods using a laser beam, sand blast, or the like. The present invention does not discriminate these blind via holes on account of the method to be employed for boring them.

Now, the method for embodying the present invention in the laminated circuit board A mentioned above will be described. The resinous insulating layers 2 and 10 are formed by applying the curable resin composition of the present invention by a suitable method such as, for example, the screen printing method, spray coating method, or curtain coating method to a second conductor layer 3 and a fifth conductor layer 9 bearing prescribed circuit patterns and formed with copper foil on the opposite surfaces of the laminated circuit board A and then thermally curing the applied layers of the composition.

Then, a through-hole 21 is formed in such a manner as to pierce the resinous insulating layers 2 and 10 and the laminated circuit board A. This through-hole 21 can be formed by a suitable means such as a drill, a metal punch, or a laser beam.

Thereafter, the resinous insulating layers 2 and 10 are subjected to a surface coarsening treatment using a coarsening agent.

The coarsening agents which can be used for this surface coarsening treatment include oxidizing agents such as potassium permanganate, potassium bichromate, ozone, hydrochloric acid, sulfuric acid, nitric acid, and hydrofluoric acid; organic solvents such as N-methyl-2-pyrrolidone, N,N-dimethyl formamide, dimethyl sulfoxide, and methoxy propanol; and alkalis such as sodium hydroxide and potassium hydroxide, for example. When an oxidizing agent, for example, is adopted as the coarsening agent, the resinous insulating layers 2 and 10 are swelled with such an organic solvent as is mentioned above and then subjected to the surface coarsening treatment using the oxidizing agent. By this surface coarsening treatment, an undulating surface construction can be easily formed on the resinous insulating layers 2 and 10 and the wall surrounding the through-hole 21.

Then, conductor layers are formed on the surfaces of the resinous insulating layers 2 and 10 by electroless plating, electrolytic plating, or the combination of electroless plating and electrolytic plating. As a result, the conductor layers are formed not only on the surfaces of the resinous insulating layers 2 and 10 but also on the entire surfaces of the through-hole 21 and the blind holes subsequently, etching resists are printed on the surfaces of the conductor layers by the screen printing or offset printing, the exposed portions of the conductor layers are etched, and thereafter the etching resists are removed. In this manner, prescribed circuit patterns are formed on the conductor layers overlying the surfaces of the resinous insulating layers 2 and 10 to complete the first conductor layer 1 and the sixth conductor layer 11 as shown in FIGURE. At this time, a plating layer is formed also on the inner surface of the through-hole 21 as mentioned above. As a result, this plating layer constitutes itself the plated-through hole 20 which electrically interconnect the connection part 1a of the first conductor layer 1, the connection part 7a of the fourth conductor layer 7, and the connection part 11a of the sixth conductor layer 11 in the multilayer printed circuit board mentioned above.

Though the embodiment described thus far represents a case of forming resinous insulating layers and conductor layers on a laminated circuit board, the present invention can be likewise embodied by using a one-sided circuit board or a double-sided circuit board in the place of the laminated circuit board.

Now, working examples and comparative examples which have specifically demonstrated the effect of the present invention will be described below. Examples 1 through 6 and Comparative Examples 1 through 4

Curable resin compositions were prepared in the formulas (in parts by weight) shown in Tables 1 and 2. In the preparation of the curable resin compositions of these working examples and comparative examples, EPIKOTE 1001 and YDCN-704 were used in the form of resinous solutions prepared in advance by dissolving the respective epoxy resins in carbitol acetate at normal room, temperature. Each resinous solution had 0.5 part by weight of KS-66 as an anti-foaming agent and 3 parts by weight of AEROSIL #200 (trademark of Nippon Aerosil Co., Ltd. for finely powdered silicon oxide) as a printability enhancer added thereto and dispersed therein and was kneaded with a three-roll kneader. It was further diluted with carbitol acetate to a point where the diluted resinous solution could be applied to a surface of a circuit board by screen printing.

Examples 1 through 4 used epoxy resins, in varied proportions and Examples 5 and 6 used a filler and a rubber component additionally. As respect the comparative examples, Comparative Example 1 used another epoxy resin instead of a bisphenol A type epoxy resin having an epoxy equivalent of not less than 400, Comparative Examples 2 and 4 contained a bisphenol A type epoxy resin having an epoxy equivalent of not less than 400 in proportions deviating from the range defined by the present invention, and Comparative Example 3 used a filler and a rubber component in addition to an epoxy resin other than a bisphenol A type epoxy resin having an epoxy equivalent of not less than 400. These curable resin compositions were each applied by screen printing to a board having a circuit formed in advance thereon, thermally cured at 150° C. for 30 minutes, and then subjected to a surface coarsening treatment using a coarsening agent (oxidizing agent, solvent, or alkali solution). The surface coarsening treatment was carried out by first swelling a sample with a mixture of 20% by weight of 1-methoxy-2-propanol, 5% by weight of sodium hydroxide, and 75% by weight of water, coarsening the swelled sample with an oxidizing agent (aqueous 6–7% $KMnO_4$ solution), and rinsing the sample in an aqueous 0.1–0.2% sulfuric acid solution, and the roughness of the coarsened surface was determined. The coarsened surface of the sample was subjected to electroless copper plating and electrolytic copper plating and thereafter to annealing. The resultant sample was tested for coating properties to evaluate it as a copper-plated circuit board. The results are shown in Tables 1 and 2.

TABLE 1

| Composition | Examples | | | | | |
|---|---|---|---|---|---|---|
| | 1 | 2 | 3 | 4 | 5 | 6 |
| EPIKOTE [a)] 1001 | 90 | 70 | 50 | 30 | 50 | 50 |
| EPIKOTE [b)] 828 | 10 | — | 20 | 20 | 20 | 20 |
| DEN [c)] -431 | — | 30 | 30 | 30 | 30 | 30 |
| YDCN [d)] -704 | — | — | — | 20 | — | — |
| Dicyandiamide | 5 | 5 | 5 | 5 | 5 | 5 |
| 2E4MZ [e)] | 5 | 5 | 5 | 5 | 5 | 5 |
| CTBN 1300-31 [f)] | — | — | — | — | — | 20 |
| Calcium carbonate | — | — | — | — | 50 | 50 |
| Roughness after coarsening treatment [g)] ($\mu$m) | 3.2 | 4.0 | 3.8 | 3.1 | 5.2 | 4.9 |
| Blister after annealing of plate layer | Absence | Absence | Absence | Absence | Absence | Absence |
| Peel strength (kg/cm) | 0.8 | 1.2 | 1.0 | 0.7 | 1.4 | 1.5 |
| Soldering heat resistance (260° C. × 30") | ○ | ○ | ○ | ○ | ○ | ○ |

TABLE 2

| Composition | Comparative Examples | | | |
|---|---|---|---|---|
| | 1 | 2 | 3 | 4 |
| EPIKOTE [a)] 1001 | — | 20 | — | 100 |
| EPIKOTE [b)] 828 | 30 | 30 | 30 | — |
| DEN [c)] -431 | 50 | 50 | 50 | — |
| YDCN [d)] -704 | 20 | — | 20 | — |
| Dicyandiamide | 5 | 5 | 5 | 5 |
| 2E4MZ [e)] | 5 | 5 | 5 | 5 |
| CTBN 1300-31 [f)] | — | — | 20 | — |
| Calcium carbonate | — | — | 50 | — |
| Roughness after coarsening treatment [g)] ($\mu$m) | 1.0 | 1.5 | 1.8 | 2.3 |
| Blister after annealing of plate layer | Presence | Presence | Absence | Absence |
| Peel strength (kg/cm) | — (impossible to measure) | — (impossible to measure) | 0.2 | 0.6 |
| Soldering heat resistance (260° C. × 30") | x | x | x | x |

[a)] Trademark of Yuka-Shell Epoxy K.K. for bisphenol A type epoxy resin (epoxy equivalent: 450–550)
[b)] Trademark of Yuka-Shell Epoxy K.K. for bisphenol A type epoxy resin (epoxy equivalent: 170–190)
[c)] Trademark of The Dow Chemical Co. for phenol novolak type epoxy resin (epoxy equivalent: 172–179)
[d)] Product code of Tohto Kasei Co., Ltd. for cresol novolak type epoxy resin marketed under trademark designation of "Epo Tohto" (epoxy equivalent: 200–230)
[e)] Product code of Shikoku Chemicals Co., Ltd. for an epoxy resin curing promotor marketed under trademark designation of "CUREZOL"
[f)] Carboxy terminated acrylonitrile rubber (CTBN) manufactured by Ube Industries, Ltd.
[g)] Depth of undulation in cross-section of coarsened surface The marks indicated in Tables 1 and 2 as results of rating of properties are based on the following scales. Resistance to heat of soldering:

A given sample was left floating on a solder bath kept at 260° C. for 3 cycles each of 10 seconds (total 30 seconds). After the floating, the sample was examined with respect to "blister" of the copper plate layer.

○: Absence of discernible blister
x: Occurence of blister

The peel strength of the copper plate layer was determined in accordance with the method specified in JIS (Japanese Industrial Standards) C-6481 except that the peeling velocity of 100 mm/min. was employed.

It is clearly noted from Tables 1 and 2 that the surface coarsening treatment produced no sufficient roughness in Comparative Examples 1 and 3 using curable resin compositions which did not contain a bisphenol A type epoxy resin having an epoxy equivalent of not less than 400, that the sample of Comparative Example 1 was blistered and the sample of Comparative Example 3 was not blistered after annealing of the plate layer, that the samples of Comparative Examples 1 and 3 were both blistered in a test for resistance to the heat of soldering (260° C.×30 seconds), and that the sample of Comparative Example 1 did not tolerate a test for peel strength. With respect to Comparative Examples 2 and 4 using curable resin compositions which contained a bisphenol A type epoxy resin having an epoxy equivalent of not less than 400 in proportions deviating from the range defined by the present invention, it is noted that the sample of Comparative Example 2 containing bisphenol A type epoxy resin having an epoxy equivalent of not less than 400 in a proportion deviating from the lower limit of the range specified by the present invention was blistered and the sample of Comparative Example 4 containing the bisphenol A type epoxy resin in a proportion deviating from the upper limit of the range was not blistered after the annealing of the plate layer, that both the samples were blistered in a test for resistance to the heat of soldering and were heavily deficient in peel strength, and that the sample of Comparative Example 2 did not tolerate the test for peel strength. In contrast to these comparative examples, the samples of Examples 1 through 6 using curable resin compositions in accordance with the present invention were found to possess outstanding peel strength and surface roughness. These excellent results may be logically explained by a supposition that their coarsened surfaces had an unusually fine undulating profile and consequently enjoyed improved peel strength. Further, the samples of all the working examples were stable to resist the heat of soldering and could be used satisfactorily as copper-clad laminates. They demonstrate that the incorporation of a bisphenol A type epoxy resin having an epoxy equivalent of not less than 400 in proportions in the range of from 30 to 90 parts by weight per 100 parts by weight of the epoxy resin components in a curable resin composition contributed to improve peel strength and resistance to the heat of soldering. It is found by comparing Example 3 with Examples 5 and 6 that the curable resin composition additionally incorporating a filler capable of being decomposed or dissolved by a coarsening agent enjoyed greater roughness of the surface of the resinous insulating layer after the surface coarsening treatment and acquired still greater peel strength.

While certain specific embodiments and working examples have been disclosed herein, the invention may be embodied in other specific forms without departing from the spirit or essential characteristics thereof. The described embodiments and examples are therefore to be considered in all respects as illustrative and not restrictive, the scope of the invention being indicated by the appended claims rather than by foregoing description and all changes which come within the meaning and range of equivalency of the claims are, therefore, intended to be embraced therein.

What is claimed is:

1. A curable resin composition, which comprises:
   (A) epoxy resins and (B) an epoxy resin curing agent, said epoxy resins (A) comprising (A-1) a bisphenol A epoxy resin having an epoxy equivalent of not less than 400 and (A-2) an epoxy resin having an epoxy equivalent of less than 400 and containing at least two epoxy groups in the molecular unit thereof in the ratio of said epoxy resins (A-2:A-2) in the range of from 30:70 to 90:10 by weight so that a cured coating film formed of the resin composition can be partially decomposed or dissolved with a coarsening agent and consequently endowed with an undulating coarsened surface, and said epoxy resin curing agent (B) containing at least two active hydrogen atoms in the molecular unit thereof,
   wherein no rubber is present in said composition.

2. The composition according to claim 1, which further comprises a filler capable of being decomposed or dissolved by said coarsening agent in a proportion of less than 70 parts by weight, based on 100 parts by weight of said epoxy resins (A).

3. The composition according to claim 1, wherein said epoxy resin (A-2) has no hydroxyl group in the molecular unit thereof.

4. The composition according to claim 1, wherein said epoxy resin (A-2) has less hydroxyl groups than said bisphenol A epoxy resin (A-1).

5. The composition according to claim 1, wherein said epoxy resin (A-2) is selected from the group of bisphenol A epoxy resins, bisphenol F epoxy resins, bisphenol S epoxy resins, phenol novolak epoxy resins, cresol novolak epoxy resins, alicyclic epoxy resins, triazine nucleus-containing epoxy resins, biphenyl epoxy resins, brominated epoxy resins, dimer acid-modified epoxy resins, trihydroxyphenyl methane epoxy resins, hydrogenated bisphenol A epoxy resins, glycidyl amine epoxy resins, tetraphenylol ethane epoxy resins, and heterocyclic epoxy resins.

6. The composition according to claim 1, wherein said epoxy resin curing agent (B) is selected from the group of amines, amino-polyamide resins, dicyandiamide, dihydrazide adipate, and hydrazide sebacate.

7. The composition according to claim 1, wherein said epoxy resin curing agent (B) is amino groups-containing compound and is incorporated in the composition in a proportion such that the active hydrogen content in said compound is in the range of from 0.5 to 1.5 equivalent weights per one equivalent weight of epoxy group content in said epoxy resins (A).

8. The composition according to claim 1, wherein said epoxy resin curing agent (B) is dicyandiamide and is incorporated in the composition in a proportion such that the active hydrogen content in dicyandiamide is in the range of from 0.3 to 0.7 equivalent weight per one equivalent weight of epoxy group content in said epoxy resins (A).

9. The composition according to claim 2, wherein said filler is an organic filler selected from the group of powdered epoxy resins, melamine resins, benzoguanamine resins, urea resins, and cross-linked acryl polymers.

10. The composition according to claim 2, wherein said filler is an inorganic filler selected from the group of magnesium oxide, calcium carbonate, zirconium silicate, zirconium oxide, calcium silicate, and calcium hydroxide.

11. The composition according to claim 1, which further comprises an organic solvent.

12. The composition according to claim 1, which further comprises an epoxy resin curing promotor.

13. The composition according to claim 1, which further comprises at least one additive selected from the group of color pigments, anti-foaming agents, and leveling agents.

* * * * *

UNITED STATES PATENT AND TRADEMARK OFFICE
CERTIFICATE OF CORRECTION

PATENT NO. : 6,518,331 B2
DATED : February 11, 2003
INVENTOR(S) : Akio Sekimoto

It is certified that error appears in the above-identified patent and that said Letters Patent is hereby corrected as shown below:

<u>Title page,</u>
Item [62], Related U.S. Applications Data, "Division of application No. 08/437,382, filed on Mar. 16, 1998" should read -- Division of applications Serial No. 08/437,382, filed on May 9, 1995 --.

Signed and Sealed this

Twenty-third Day of September, 2003

JAMES E. ROGAN
*Director of the United States Patent and Trademark Office*